United States Patent [19]

van den Berg et al.

[11] Patent Number: 5,223,337
[45] Date of Patent: Jun. 29, 1993

[54] TOOL PRODUCED BY A PLASMA-ACTIVATED CVD PROCESS

[75] Inventors: Hendrikus van den Berg, Venlo-Blerick, Netherlands; Udo König, Essen, Fed. Rep. of Germany; Ralf Tabersky, Bottrop, Fed. Rep. of Germany; Josef Blum, Essen, Fed. Rep. of Germany

[73] Assignee: Fried. Krupp GmbH, Essen, Fed. Rep. of Germany

[21] Appl. No.: 797,113

[22] Filed: Nov. 21, 1991

Related U.S. Application Data

[62] Division of Ser. No. 448,337, Dec. 11, 1989, Pat. No. 5,093,151.

[30] Foreign Application Priority Data

Dec. 10, 1988 [DE] Fed. Rep. of Germany ....... 3841731
Aug. 21, 1989 [DE] Fed. Rep. of Germany ... 8909928[U]
Aug. 22, 1989 [DE] Fed. Rep. of Germany ... 8910041[U]

[51] Int. Cl.$^5$ .......................... C23C 28/04; B32B 27/00
[52] U.S. Cl. ...................................... 428/336; 51/295; 51/307; 51/309; 407/119; 428/472; 428/697; 428/698; 428/699
[58] Field of Search ............... 428/698, 697, 699, 472, 428/336, 216; 407/119; 51/295, 307, 309

[56] References Cited

U.S. PATENT DOCUMENTS

| | | | |
|---|---|---|---|
| 4,500,563 | 2/1985 | Ellenberger et al. | 427/38 |
| 4,675,206 | 6/1987 | Ikegaya et al. | 427/37 |
| 4,708,037 | 11/1987 | Buljar et al. | 428/698 |
| 4,720,437 | 1/1988 | Chudo et al. | 428/699 |
| 4,758,451 | 7/1988 | van den Berg et al. | 427/249 |
| 4,915,977 | 4/1990 | Okamoto et al. | 427/37 |

FOREIGN PATENT DOCUMENTS

| | | |
|---|---|---|
| 0196201 | 10/1986 | European Pat. Off. . |
| 0199527 | 10/1986 | European Pat. Off. . |
| 0073392 | 6/1979 | Japan . |
| 1-104773 | 4/1989 | Japan . |
| 1601224 | 10/1981 | United Kingdom . |
| 2194556 | 3/1988 | United Kingdom . |

OTHER PUBLICATIONS

Schedler "Hartmetall für den Praktiker", *VDI-Verlag GmbH* pp. 492-494 (1988).
van der Straten, P. J. M. et al. "Aufbringen verschleissfester Schichten auf Werkzeugstahl nach dem CVD-Verfahren", *VDI-Z*, vol. 124, No. 18, Sep. 1982 pp. 693-698.
Munster "Eigenschaften und Anwendungen von Titannitrid und Titancarbid", *Angewandte Chemie*, vol. 69, No. 9, pp. 281-312 (May 1957).

*Primary Examiner*—Ellis P. Robinson
*Assistant Examiner*—A. Turner
*Attorney, Agent, or Firm*—Spencer, Frank & Schneider

[57] ABSTRACT

A tool having an extended service lift and including a hard metal body, and at least one surface layer composed of at least one hard substance selected from the group consisting of carbides, nitrides, and carbonitrides of titanium and zirconium, and having a chlorine content ranging from a finite amount up to 4 mass percent, the tool being produced by plasma-activated CVD process including: a. positioning the hard metal body in a CVD chamber having means for supplying direct voltage thereto, the hard metal body being connected to the direct voltage supplying means as a cathode thereof, b. introducing into the CVD chamber a reactive gas mixture including a nitrogen-containing substance, a carbon-containing substance, and at least one compound containing at least one of titanium and zirconium, and c. exciting plasma formation at the hard metal body and coating same by chemical vapor deposition by applying a pulsed direct voltage and a residual direct voltage thereto, the residual direct voltage having a magnitude which is at least equal to the lowest ionization potential of any gas in the reactive gas mixture but does not exceed 50% of the maximum value of the pulsed direct voltage.

16 Claims, 4 Drawing Sheets

TOOL PRODUCED BY A PLASMA-ACTIVATED CVD PROCESS

This is a division of application Ser. No. 07/448,337 filed Dec. 11, 1989 now U.S. Pat. No. 5,093,151.

CROSS-REFERENCE TO RELATED APPLICATIONS

This Application claims the priority of application Ser. Nos. P 38 41 731.6, G 89 09 928.1 and G 89 10 041.7, filed, respectively, on Dec. 10, 1988, Aug. 21, 1989, and Aug. 22, 1989, in the Federal Republic of Germany the subject matter of which is incorporated herein by reference.

BACKGROUND OF THE INVENTION

1. Field of the Invention

The invention relates to a plasma-activated CVD (chemical vapor deposition) process for coating a basic tool body, preferably made of hard metal or steel, with at least one surface layer composed of hard substances, e.g., at least one of carbides, nitrides and/or carbonitrides of titanium and/or zirconium. The invention also relates to a tool produced by a method including the plasma-activated CVD process, and to the process of cutting plastic sheets coated with magnetic materials into magnetic tape suitable for the storage of audio or video signals using the aforementioned tool configured as a circular shearing blade.

2. Description of the Related Art

The German periodical *Angewandte Chemie* [*Applied Chemistry*], Volume 69, No. 9, pages 281–312, (May 7, 1957), describes circumventing the brittleness of hard substances by applying the hard substances in the form of thin surface coatings in order to protect recipient substrates against mechanical or chemical stresses. The article mentions, for example, the coating of sheet metal with a 6 $\mu$m coating of TiN.

Additionally, Swiss Patent No. 507,094 discloses, for example, a molded body composed of a hard metal substrate and at least one hard substance layer, with the hard metal substrate being composed of one or a plurality of hard substances and at least one binder metal, and the hard substance layer(s) including hard carbides or nitrides. Since such molded bodies have good wear characteristics, they can be employed for tools used in cutting, as well as noncutting shaping. The molded bodies are produced according to the CVD process as it is disclosed, for example, in Swiss Patent No. 452,205. At present, the CVD process is one of the most commonly employed coating processes and involves depositing a surface layer on a substrate from a reactive gas atmosphere which generally has a temperature between 900° and 1,200° C. The gas atmosphere includes several compounds which react with one another at the reaction temperature and form the substance comprising the surface coating by precipitation thereof onto the substrate.

Today, it is customary to coat metal substrates with hard substance layers composed of carbides, nitrides or carbonitrides, with the gas atmosphere including halogenides of elements of Groups III to VI of the Periodic Table of Elements, a nitrogen-containing compound, and a carbon containing compound. For example, a titanium carbide layer may be deposited at about 1,000° C. on a basic hard metal body from a gas atmosphere which includes titanium tetrachloride and methane. Gaseous hydrocarbons, in particular, are employed as the carbon-containing compounds, while typical nitrogen-containing compounds employed include $N_2$, $NH_3$ or amines. However, the high coating temperatures of about 1,000° C. cause the composite body to lose toughness.

The German periodical VDI-Z, Vol. 124, No. 18, (September, 1982 (II)), pages 693 et seq., describes the application of wear resistant layers on tool steel by means of a CVD process. Again, the tool to be coated must remain at a high temperature for a relatively long time and the dangers arise of development of crystals in the steel and disadvantageous stabilization of the austenitic phase, the high temperature phase of steel, rather than reversion to the martensitic phase on cooling. At the conclusion of the CVD process, the reactor is cooled under hydrogen at a cooling rate ranging from 20° to 50° C./min. Steels which are hardened by being quenched in water or oil, however, do not reach their maximum hardness under these conditions. This again confirms that high CVD temperatures bring about undesirable side effects.

In order to provide a lower deposition temperature, a process referred to as the plasma-supported CVD process has been proposed. In a plasma of a low pressure glow discharge, the gas mixture is composed of neutral particles, molecules, dissociated molecules, ions and electrons. Due to the lack of an equilibrium state during the low pressure discharge, the temperature of the electrons is several thousand degrees higher than that of the heavy particles, i.e., ions and neutral particles. This causes activation of the chemical reaction(s) of the CVD process and at temperatures below the 1,000° C. otherwise required in a CVD process. A low pressure plasma may be generated using DC or HF sources, for example, by application of a DC voltage (hereinafter referred to as a direct voltage) or a high frequency AC voltage, at pressures ranging from 10 to 1,000 Pascal.

The simplest way to produce a low pressure discharge is to connect the workpiece to be coated to the cathode of a direct current source and to connect the walls of the CVD chamber, at least a portion of which are electrically conductive, to the anode of the direct current source. However, the more expensive high frequency process can be operated without electrodes and, advantageously, metal, as well as non-metal, substrates can be coated with this process. The substrate temperature is, moreover, a function of the high frequency energy introduced. However, this process is very complicated and relatively expensive.

European published Application No. 0,199,527 A1 additionally discloses a plasma CVD process in which a negative direct voltage of up to 1,500 volts is applied to the substrate to be coated to excite the plasma and superposed on this direct voltage is a high frequency voltage at, for example, 13.56 MHz.

Federal Republic of Germany published Application No. 3,027,688 B1 discloses a process in which, subsequent to application of a surface coating, a negative direct voltage is applied to the composite body in an inert gas atmosphere at a pressure ranging from $10^{-2}$ to $10^2$ mbar and at a temperature ranging from 200° to 800° C. These conditions suffice to maintain a glow discharge for at least ten minutes.

Federal Republic of Germany published Application No. 601,847 A discloses a process for heat treating metals, particularly for carboreting iron or tungsten, respectively, in a partial vacuum in which the glow discharge is a sudden discharge of a capacitive energy store, i.e., is generated by short-term voltage pulses which have a pulse duration of about $10^{-5}$ to $10^{-6}$ seconds. The pause intervals between the individual pulses are selected to be at least ten times as long as the pulse duration itself so that the gas path can be deionized in the meantime.

SUMMARY OF THE INVENTION

It is an object of the present invention to improve the above-mentioned CVD process so that high coating temperatures on the order of 1,000° C. are avoided and the shortest possible coating time is realized with low operating costs.

It is another object of the present invention to provide a coated tool of the above-mentioned type whose surface coating is uniform and adheres well.

It is yet another object of the present invention to provide a tool configured as a circular shearing blade for cutting plastic sheet into strips, particularly for cutting plastic sheet coated with magnetic materials into magnetic tape suitable for storage of audio and video signals.

These and other objects are accomplished by providing a plasma-activated CVD process for coating a basic tool body with at least one surface layer comprised of at least one hard substance selected from the group consisting of carbides, nitrides, and carbonitrides of titanium and zirconium. The plasma-activated CVD process includes positioning a basic tool body in a CVD chamber having means for supplying direct voltage thereto, the basic tool body being connected to the direct voltage supplying means as a cathode thereof. Then, a reactive gas mixture is introduced into the CVD chamber, the reactive gas mixture being comprised of a nitrogen-containing substance, a carbon-containing substance, and at least one compound containing at least one of titanium and zirconium. Next, plasma formation is excited at the basic tool body and same is coated by chemical vapor deposition by applying a pulsed direct voltage and a residual direct voltage thereto, the residual direct voltage having a magnitude which is at least equal to the lowest ionization potential of any gas in the reactive gas mixture but does not exceed 50% of the maximum value of the pulsed direct voltage.

A significant feature of this process resides in superposing a pulsed direct voltage over a residual direct voltage, the residual direct voltage having a magnitude equal to or above the lowest ionization potential of any of the gases participating in the CVD process, especially reactive gases therein. The residual direct voltage remains during the pulse intervals as a bias. This residual voltage, however, should not exceed 50% of the maximum value of the pulsed direct voltage, both of which are provided by DC source(s).

Generally, the pulsed direct voltage according to the present invention is a rectangular voltage having a maximum amplitude ranging from 200 to 900 volts and a period duration ranging from 20 μs to 20 ms. However, deviations which result in a non-vertical rising and falling edge, and tilted pulses are also conceivable insofar as the condition remains met that the direct voltage will not drop to zero between two maximum voltage values but always remains above the lowest ionization potential of the gases participating in the CVD process and below 50% of the maximum voltage deflection. Preferably, a ratio of the (average) residual direct voltage to the maximum pulsed direct voltage is set to range from 0.02 to 0.5. According to a modification of the invention, a ratio of pulse length, i.e., duration of a positive voltage signal of a pulse, to pulse interval, i.e., the interval between two pulses, ranges from 0.1 to 0.6. During the CVD step, deposition takes place preferably at a temperature ranging from 400° to 600° C., and the layer has a growth rate which ranges from 0.5 to 10 μm/h.

In contrast to known low temperature coating processes, such as magnetron cathode sputtering, ion plating and arc evaporation, which operate in a pressure range in which the reactive species propagates substantially linearly thus causing shading effects, the present invention makes it possible to employ a low temperature CVD process which is easy to charge and provides a good coating on all sides. To produce a low pressure glow discharge according to the invention in which, for example, the CVD chamber is maintained at a pressure ranging from 10 to 1,000 Pascal during plasma excitation and deposition by CVD, a pulse generator is employed which makes it possible to substantially decouple the plasma parameters from the substrate temperature. The pulsed gas discharge considerably reduces the danger of arc discharges at high currents or voltages so that, with suitable monitoring, a quick turn-off prevents damage to the substrate. However, during the pulse intervals, a direct voltage from the DC source remains in effect which is at least as high as the lowest ionization potential of the gas molecules participating in the CVD process. The maximum value of the residual direct voltage is 50% of the maximum value of the pulsed voltage. The ionization potentials of the gas molecules participating in the CVD process are listed as follows:

| H:  | 13.6 eV | $H_2$: | 15.8 eV |
|-----|---------|--------|---------|
| N:  | 14.5 eV | $N_2$: | 15.7 eV |
| Ar: | 15.7 eV | Ti:    | 13.57 eV |

The objects are further realized by a tool having an extended service life and including a basic tool body; and at least one surface layer comprised of at least one hard substance selected from the group consisting of carbides, nitrides, and carbonitrides of titanium and zirconium, and having a chlorine content ranging from a finite amount up to 4 mass percent. The tool is produced by a plasma-activated CVD process which includes positioning a basic tool body in a CVD chamber having means for supplying direct voltage thereto, the basic tool body being connected to the direct voltage supplying means as a cathode thereof. Next, a reactive gas mixture comprised of a nitrogen-containing substance, a carbon-containing substance, and at least one compound containing at least one of titanium and zirconium is introduced into the CVD chamber. Then, plasma formation is excited at the basic tool body and same is coated by chemical vapor deposition by applying a pulsed direct voltage and a residual direct voltage thereto, the residual direct voltage having a magnitude which is at least equal to the lowest ionization potential of any gas in the reactive gas mixture but does not exceed 50% of the maximum value of the pulsed direct voltage. The basic tool body is comprised of one of hard metal and steel.

When the at least one surface layer is a plurality of surface layers and is arranged in a sequence, a preferred surface layer sequence, beginning with the surface layer closest to the basic tool body, is a TiN layer, one or a plurality of Ti(C,N) layers, and a TiN layer. Such an arrangement has been found to provide a coating which is particularly wear resistant, as well as having sufficient hardness.

Preferred basic tool bodies, moreover, are essentially composed of tungsten carbide, WC, and from 6 to 10 mass percent of a binder. Preferably the binder is cobalt, Co. According to a modification of the invention, from a finite amount up to 30% of the WC may be replaced by at least one carbide selected from TiC, TaC and NbC.

Preferably the total thickness of the at least one surface layer does not exceed 20 μm. Moreover, sufficiently good properties are obtained if no surface layer exceeds 5 μm.

The invention additionally relates to a tool in the form of, for example, a circular shearing blade, particularly a top-action blade for cutting plastic sheet coated with magnetic materials into magnetic tape suitable for storage of audio or video signals. The sheeting to be cut is made of plastic, e.g., polyester, and is coated with a layer of, for example, iron oxide and/or chromium oxide. The tool is composed of an annular, flat hard metal body coated with at least one uniformly plane parallel surface layer having a thickness ranging from 1 to 4 μm and composed of carbides, nitrides and/or carbonitrides of titanium and zirconium. The deviation from plane parallelism of the surface coating is <0.003 mm and/or its roughness $R_Z$ is <0.08 μm.

The objects of the present invention are thus additionally accomplished by the process of cutting a plastic sheet coated with magnetic materials into magnetic tape for storage of audio or video signals, the process including contacting the plastic sheet to cut same with at least one circular shearing blade comprised of a hard metal body which is annular and flat, and which is coated with at least one surface layer comprising at least one hard substance selected from the group consisting of carbides, nitrides, and carbonitrides of titanium and zirconium, each of the at least one surface layer having a thickness ($d_1$) ranging from 1 to 4 μm, being uniformly plane parallel to each respective surface of the hard metal body, and having at least one of a deviation from plane parallelism which is less than 0.003 mm and a roughness ($R_z$) which is less than 0.08 μm. Preferably, the at least one surface layer will have a thickness ($d_1$) ranging from 2 to 3 μm.

Magnetic tapes belong to what is referred to as moving laminar memories and are provided, for example, with a coating of needle-shaped iron oxide crystals. The storage of electrical signals resides in the directed magnetization of the needles and the substrate travels at a constant speed past an electromagnetic transducer, i.e., a so-called magnetic head.

The magnetic tapes are cut from relatively broad sheets by means of blades which move with offset edges. Since the plastic sheets to be cut are coated with magnetic materials, such as a coating containing ferrite powder, the material is very abrasive. For that reason, it has already been proposed to employ circular shearing blades made of a tungsten carbide hard metal of an average grain size and including from 6 to 15% cobalt (see *Hartmetall für den Praktiker* [*Hard Metal for the Practician*], Schedler, W., published by VDI-Verlag GmbH (1988) page 494). Nevertheless such blades have been found to wear out relatively quickly and must frequently be resharpened along their circumferential faces. Resharpening requires exchange of the blades in each case.

Prior art coatings have been generally applied to sheet metals and also to relatively large, inflexible, shaped hard metal bodies by PVD (physical vapor deposition) and CVD processes. However, a PVD coating on circular shearing blades can be applied only from one side. Additionally, a surface coating applied by means of a PVD process is uneven and has high compressive strain so that the blade becomes deformed and unusable.

The high coating temperatures of about 1,000° C. required in prior art CVD processes cause the thin circular shearing blades to be deformed and additionally cause, in the composite body, a loss of toughness which is expressed as an increased susceptibility to breakage. Such circular shearing blades are also unusable as well.

The circular shearing blades according to the invention advantageously include a hard metal body having a thickness ranging from 0.4 to 0.8 mm, preferably from 0.5 and 0.6 mm. Preferably, the circular shearing blades have at least one of an external diameter ranging from to 150 mm, preferably between 100 and 125 mm, and a central bore having a diameter ranging from 50 to 80 mm, preferably ranging from 60 to 70 mm.

The top-action circular shearing blades may be arranged in juxtaposition of up to 60 blades on one shaft and may be employed, together with appropriate bottom-action blades, to cut plastic sheets, particularly for magnetic tapes.

The preferred material for the hard metal body is composed of tungsten carbide and from 6 to 25 mass percent of cobalt, preferably from 9 to 15 mass percent of cobalt, as binder. The hard metal body may have from a finite amount up to 30 mass percent of the tungsten carbide replaced by at least one carbide selected from titanium carbide, tantalum carbide and niobium carbide. According to another feature of the invention, the at least one surface layer has a chlorine content ranging from a finite amount up to 4 mass percent. If one wishes to apply several layers, a layer sequence, beginning with the surface layer closest to the basic tool body, of titanium nitride, titanium carbonitride, and titanium nitride has been found to be favorable.

BRIEF DESCRIPTION OF THE DRAWING

Further advantages of the invention will be described below with reference to embodiments thereof and to the drawing figures which.

DESCRIPTION OF THE PREFERRED EMBODIMENTS

Figure 1:
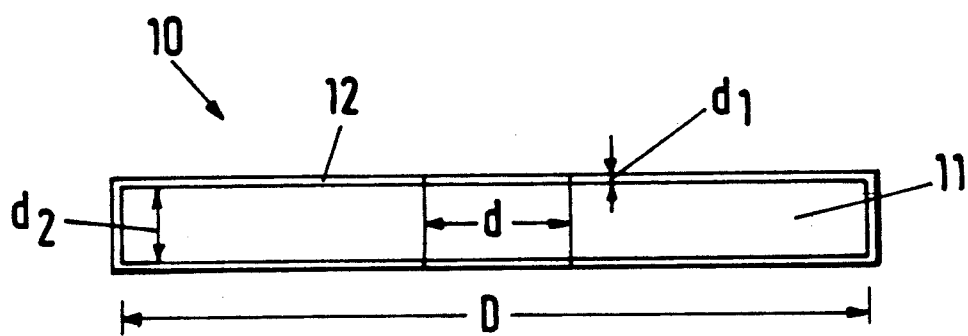
FIG. 1 is a cross-sectional view of an annular hard metal plate coated with titanium nitride.

Circular shearing blade 10 shown in FIG. 1 is composed of an annular, flat, hard metal body 11 having a thickness $d_2$ and being composed of 78.5 mass percent WC, 10 mass percent (Ti,Ta,Nb)C, 11.5 mass percent Co, and a titanium nitride layer 12 applied by the process to be described below to a thickness $d_1$. The thickness $d_2$ of the hard metal body is 0.5 mm and the thickness $d_1$ of the titanium nitride layer 12 is about 1.5 μm. The blade 10 has an external diameter D of 106.5 mm and an internal diameter d of 70 mm.

A pulsed direct voltage in a plasma-supported CVD process is employed for depositing the coating and is, generally, a rectangular voltage having a maximum amplitude between 200 and 900 volts and a period duration between 20 μms and 20 ms. Deviations which form non-vertical ascending and descending edges, as well as tilts, are also conceivable insofar as the condition remains met that, between two maximum voltage values, the direct voltage does not drop to zero but always remains above the lowest ionization potential of any of the participating CVD gases and below 50% of the maximum voltage deflection. Preferably, the ratio of the average residual direct voltage to the maximum pulsed direct voltage is set to lie between 0.02 and 0.5. According to a modification of the process, the ratio of pulse length, duration of the positive voltage signal of a pulse, to the pulse interval between two pulses ranges from 0.1 to 0.6. The deposition temperature was about 550° C. so that, under the set conditions, a layer growth rate ranging between 0.5 and 10 μm/h developed.

Figure 3:
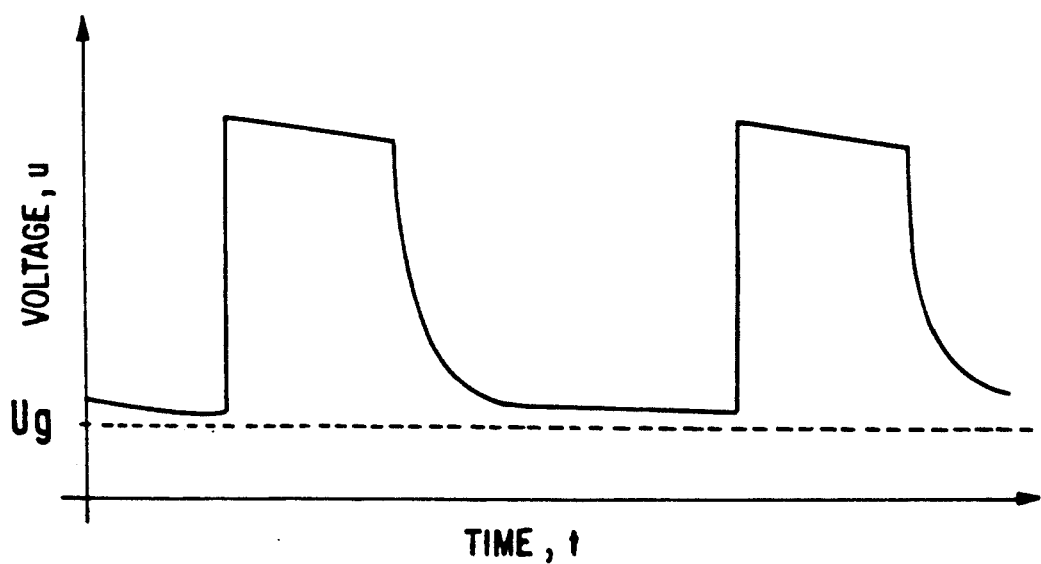
FIG. 3 is an electrical voltage curve for generating a low temperature, low pressure glow discharge at the hard metal body to be coated by CVD.

The schematic curve (voltage (V) versus time (t)) for the pulsed direct voltage is shown in FIG. 3. $U_g$ identifies the lower cut-off voltage determined by the lowest ionization potential of any of the gases participating in the CVD process. The circular shearing blades coated by means of the inventive plasma pulse CVD process were also plane parallel having a deviation <0.003 mm and a roughness value $R_Z$ of <0.08 μm.

At a test station, comparison tests were made between uncoated circular shearing blades and circular shearing blades coated according to the invention. The length of the cut was about 590 km. The circular shearing blades without surface coating became dull in the normal manner as a function of the duration of the test. Increasing dullness was evidenced by decreasing quality of the edge of the cut magnetic tape. The tape edge developed beads. With circular shearing blades equipped with a titanium nitride coating according to the present invention as described, uniform tape edge quality at a very high level could be realized from beginning to end of the test. As a whole, the inventive circular shearing blade permitted the realization of twice the service life without resharpening.

Figure 2:
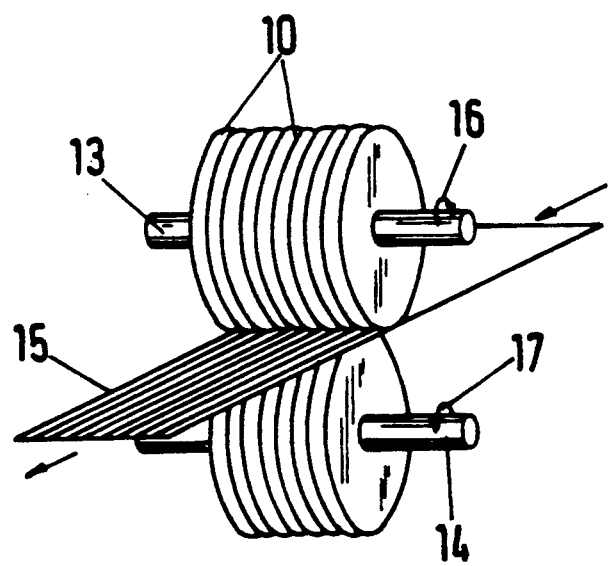
FIG. 2 is a cutting arrangement including a plurality of circular shearing blades arranged on shafts.

The circular shearing blade according to the invention is employed, for example, in an arrangement as shown in FIG. 2 in which several circular shearing blades 10 are fastened next to one another on shafts 13 and 14. The oppositely rotating shafts (indicated by arrows 16 and 17) cut a thin band 15 of coated plastic into strips of uniform width which are wound onto a carrier as magnetic tapes.

With the inventive plasma-activated CVD (PACVD) process, layers of TiN, TiC and Ti(C,N) can be deposited on a hard metal substrate individually or in any desired sequence from gas mixtures of $TiCl_4$, $H_2$, $N_2$ and/or $CH_4$, e.g., as multilayered coating having a preferred layer sequence, beginning at the substrate, of TiN/Ti(C,N)/TiN.

Titanium carbonitride can be deposited in any desired mixing ratio of C/N. The typical characteristics and compositions of inventive PACVD layers are listed in the table below:

|  | TiN | Ti (C, N) | TiC |
|---|---|---|---|
| Hardness HV 0.05 | 2000–2400 | 2200–3400 | 3000–3400 |
| Lattice constant (nm) | 0.424 | 0.424–0.433 | 0.433 |
| Typical analysis (%) |  |  |  |
| Ti | 77.5 | 78.4 | 78.1 |
| N | 19.9 | 11.2 | — |
| C | — | 8.4 | 18.9 |
| O | 0.2 | 0.9 | 1.2 |
| Cl | 0.6 | 1.1 | 0.8 |

In addition to titanium, nitrogen and/or carbon and oxygen, the layers also preferably include between 0.5 and 4 mass percent chlorine.

Cutting tools produced according to the process of the invention exhibited long service lives. For example, cutting plates SPKN 1203 EDR coated with TiC/Ti(C,N)/TiN by CVD and those coated by PACVD with 3 μm TiN, were used to cut blocks of a heat treated 42 CrMo4V steel (1,000 N/mm²) and were compared with one another. After a cutting path of 1,200 mm, the CVD-coated plate exhibited break-outs at the major cutting edge, while the PACVD-coated plate (according to the invention) is still able to cut after a cutting path of twice that length. This test shows that cutting bodies coated according to the inventive PACVD process are considerably tougher. However, they also have advantages compared to cutting bodies coated by PVD at a coating temperature about 500° C. Although the latter also have improved toughness characteristics, their wear resistance did not reach that of cutting plates coated according to the invention as will be confirmed by the following two tests.

Figure 4:
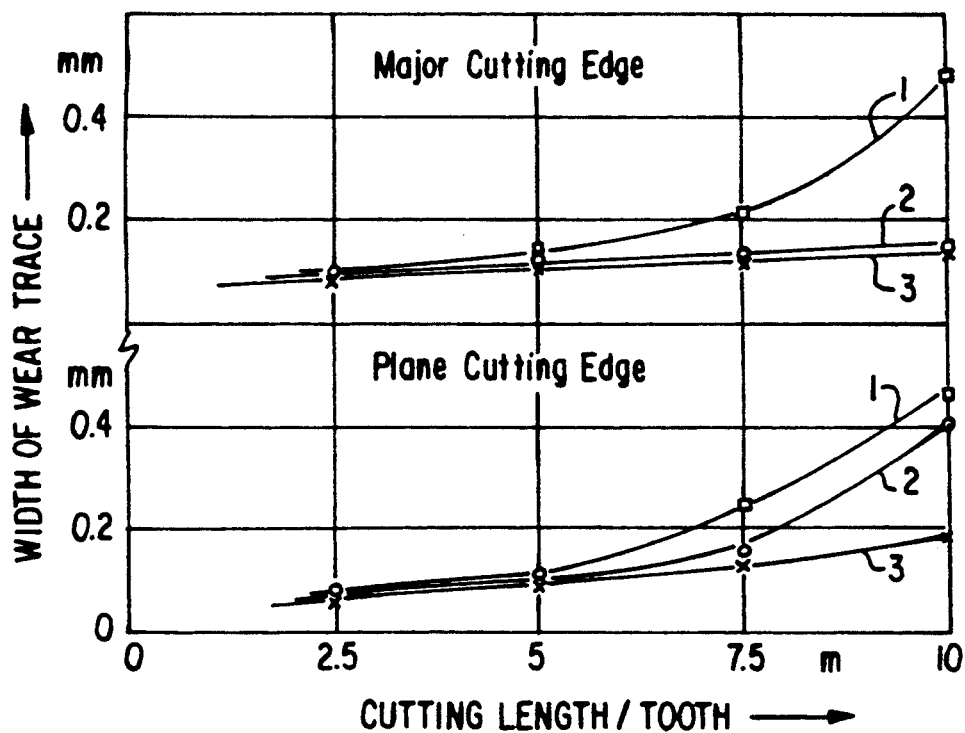
FIGS. 4 and 5, are graphic representations of the results of cutting tests performed.
Figure 6:
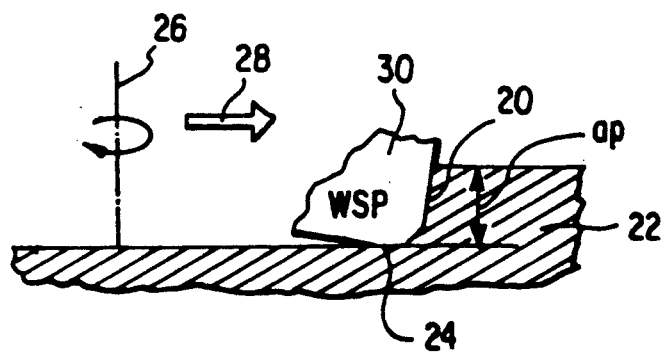
FIG. 6 illustrates the principle of a cutter test.

In another test, cutting plates were tested which were coated with TiN or TiN/Ti(C,N)/TiN by PACVD and with TiN by PVD. The principle of the cutter test is shown in FIG. 6 and the results of the test are shown in FIG. 4. FIG. 6 shows a cutting plate 30 (WSP) having a major cutting edge 20, a plane cutting edge 24, and a cutter axis 26 acting on a workpiece 22. Feed direction is shown by arrow 28. FIG. 4 compares a PVD coating 1 of TiN, a PACVD coating 2 of TiN, and a PACVD coating 3 of TiN-Ti(C,N)-TiN, all having a thickness of about 3 μm and all being applied to a reversible cutting plate SEKN 1203 AFTN, substrate TTM-S. The cutter was a WIDAX-Heinlein M68 (diameter 80, 1 tooth). During cutting of C45 steel (cutting rate 200 m/min, cutting depth 5 mm, feed/tooth 0.1 mm), the harder multilayered inventive coating as a whole shows the best results.

Figure 5:
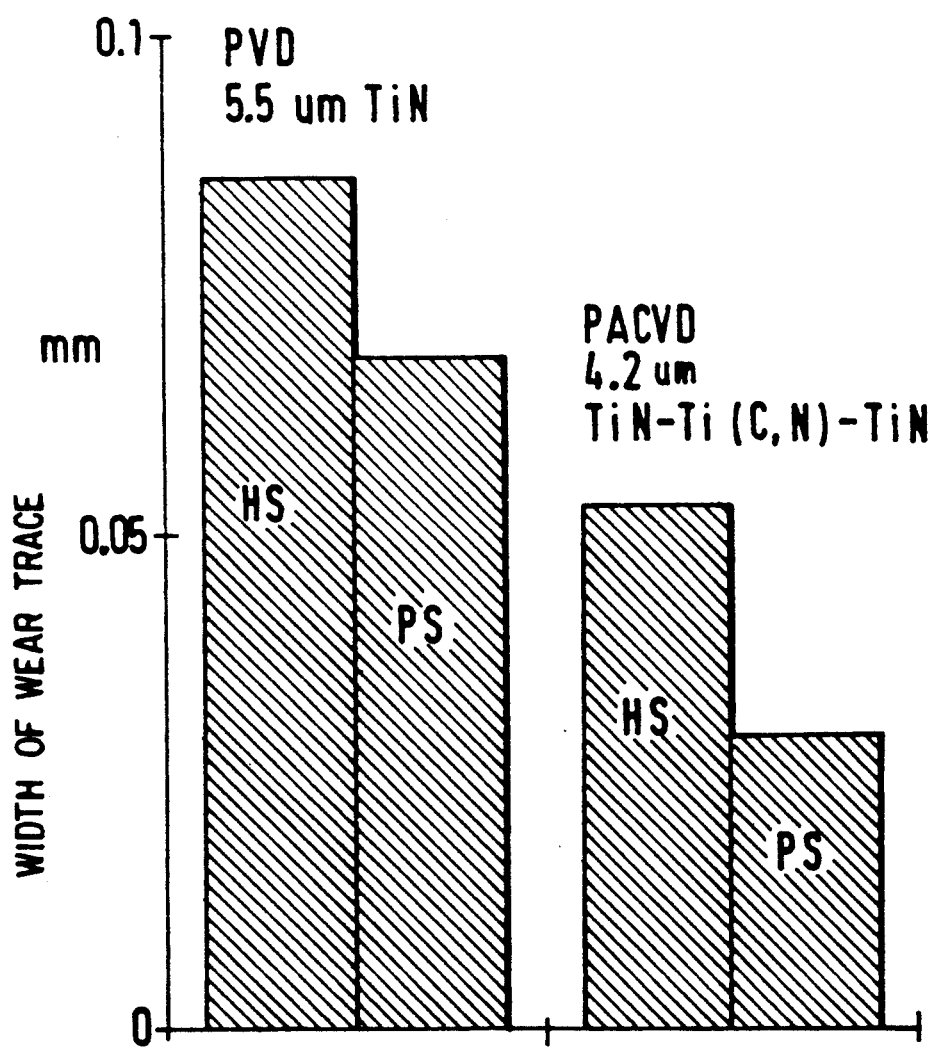

PACVD coatings also have advantages for cutting highly alloyed, austenitic steels as indicated by the result of a further cutting test shown in FIG. 5 (cutting plate: SEKN 1203 AFT; workpiece material: 28NiCr-Mo74, 195×700 mm; cutter, 6 teeth: WIDAX M65 (80 o); cutting rate: 200 m/min; cutting depth 5 mm, feed/tooth 0.2 mm; cutting length: 14 m; wear due to cratering: not measurable). FIG. 5 shows the width of wear trace in mm for the major cutting edge (HS) and the plane cutting edge (PS) for comparative PVD and inventive PACVD coatings.

In these and other tests it could be noted that the service lives known for PVD coatings were surpassed by inventive plasma-activated CVD coatings. In other cutting tests, service lives could be realized for tools produced according to the process of the invention which were more than twice, sometimes even three times as long as for the prior art cutting plates.

The titanium carbide layers deposited in a further embodiment have a fracture structure which has a clearly noticeable finely crystalline configuration. Their microhardness lay between 3000 and 3400 HV 0.05.

It will be understood that the above description of the present invention is susceptible to various modifications, changes and adaptations, and the same are intended to be comprehended within the meaning and range of equivalents of the appended claims.

What is claimed is:

1. A tool having an extended service life, comprising:
a hard metal body; and
at least one surface layer which is plasma-activated CVD coated onto the hard metal body and which is comprises of at least one hard substance selected from the group consisting of carbides, nitrides, and carbonitrides of titanium and zirconium, and having a chlorine content ranging from a finite amount up to 4 mass percent, the at least one surface layer being produced by a plasma-activated CVD process, comprising:
   a. positioning the hard metal body in a CVD chamber having means for supplying direct voltage thereto, the hard metal body being connected to the direct voltage supplying means as a cathode thereof;
   b. introducing into the CVD chamber a reactive gas mixture comprises of a nitrogen-containing substance, a carbon-containing substance, and at least one compound containing at least one of titanium and zirconium; and
   c. exciting plasma formation at the hard metal body and coating same by chemical vapor deposition by applying a pulsed direct voltage and a residual direct voltage thereto, the residual direct voltage having a magnitude which is at least equal to the lowest ionization potential of any gas in the reactive gas mixture but which does not exceed 50% of the maximum value of the pulsed direct voltage.

2. The tool according to claim 1, wherein the tool is structured as a cutting tool.

3. The tool according to claim 1, wherein the at least one surface layer has a total thickness which does not exceed 20 $\mu$m.

4. The tool according to claim 1, wherein the at least one surface layer is a plurality of surface layers and is arranged in a sequence, beginning with the surface layer closest to the basic tool body, of a TiN layer, one or a plurality of Ti(C,N) layers, and a TiN layer.

5. The tool according to claim 1, wherein no layer of the at least one surface layer has a thickness which exceeds 5 $\mu$m.

6. The tool according to claim 1, wherein the hard metal body comprises tungsten carbide and from 6 to 25 mass percent of a binder.

7. The tool according to claim 6, wherein from a finite amount up to 30 mass percent of the tungsten carbide is replaced by at least one carbide selected from the group consisting of TiC, TaC and NbC.

8. The tool according to claim 6, wherein the binder is cobalt.

9. A tool for cutting a plastic sheet coated with magnetic materials into magnetic tape for storage of audio or video signals, the tool comprising:
at least one circular shearing blade comprised of a hard metal body which is annular and flat, and which is plasma-activated CVD coated with at least one surface layer comprising at least one hard substance selected from the group consisting of carbides, nitrides, and carbonitrides of titanium and zirconium, and having a chlorine content ranging from a finite amount up to 4 mass percent, each of the at least one surface layer having a thickness ($d_1$) ranging from 1 to 4 $\mu$m, being uniformly plane parallel to each respective surface of the hard metal body, and having at least one of a deviation from plane parallelism which is less than 0.003 mm and a roughness ($R_z$) which is less than 0.08 $\mu$m, the at least one surface layer being produced by a plasma-activated CVD process, comprising:
   a. positioning the hard metal body in a CVD chamber having means for supplying direct voltage thereto, the hard metal body being connected to the direct voltage supplying means as a cathode thereof;
   b. introducing into the CVD chamber a reactive gas mixture comprised of a nitrogen-containing substance, a carbon-containing substance, and at least one compound containing at least one of titanium and zirconium; and
   c. exciting plasma formation at the hard metal body and coating same by chemical vapor deposition by applying a pulsed direct voltage and a residual direct voltage thereto, the residual direct voltage having a magnitude which is at least equal to the lowest ionization potential of any gas in the reactive gas mixture but which does not exceed 50% of the maximum value of the pulsed direct voltage.

10. The tool according to claim 9, wherein the thickness ($d_1$) ranges from 2 to 3 $\mu$m.

11. The tool according to claim 9, wherein the hard metal body has a thickness ranging from 0.4 to 0.8 mm.

12. The tool according to claim 11, wherein the hard metal body has a thickness ranging from 0.5 to 0.6 mm.

13. The tool according to claim 9, wherein the hard metal body has at least one of an external diameter (D) ranging from 80 to 150 mm and a central bore having a diameter (d) ranging from 50 to 80 mm.

14. The tool according to claim 13, wherein the external diameter ranges from 100 to 125 mm and the diameter of the central bore ranges from 60 to 70 mm.

15. The tool according to claim 9, wherein the hard metal body comprises tungsten carbide and from 6 to 25 mass percent of cobalt as a binder.

16. The process according to claim 15, wherein the hard metal body comprises tungsten carbide and from 9 to 15 mass percent of cobalt as a binder.

* * * * *